(12) United States Patent
Kim et al.

(10) Patent No.: US 10,020,118 B2
(45) Date of Patent: Jul. 10, 2018

(54) SELF-RECHARGEABLE HYBRID BATTERY AND ELECTRONIC DEVICE COMPRISING THE SAME

(71) Applicant: University-Industry Foundation, Seoul (KR)

(72) Inventors: Jung-Hyun Kim, Seoul (KR); Seung Hwan Lee, Seoul (KR); Jung Joon Lee, Seoul (KR); Dohyuk Yoo, Gangwon-do (KR); So Yeon Kim, Daejeon (KR); Se Yul Kim, Hwaseong-si (KR); Hongkwan Park, Seoul (KR)

(73) Assignee: UNIVERSITY-INDUSTRY FOUNDATION, YONSEI UNIVERSITY, Seoul (KR)

( * ) Notice: Subject to any disclaimer, the term of this patent is extended or adjusted under 35 U.S.C. 154(b) by 494 days.

(21) Appl. No.: 14/717,327

(22) Filed: May 20, 2015

(65) Prior Publication Data

US 2015/0340160 A1    Nov. 26, 2015

(30) Foreign Application Priority Data

May 20, 2014    (KR) .......................... 10-2014-0060299

(51) Int. Cl.
*H01G 9/042*    (2006.01)
*H01G 9/048*    (2006.01)
(Continued)

(52) U.S. Cl.
CPC .............. *H01G 9/042* (2013.01); *H01G 9/048* (2013.01); *H01G 9/15* (2013.01); *H01G 9/28* (2013.01);
(Continued)

(58) Field of Classification Search
CPC .......... H01G 9/042; H01G 9/048; H01G 9/15; H01G 9/28; H01G 11/08; H01G 11/30;
(Continued)

(56) References Cited

U.S. PATENT DOCUMENTS

2003/0008135 A1 *    1/2003    Kawamura ......... G02F 1/13439
428/336
2006/0219289 A1 *    10/2006    Skryabin .............. H01G 9/2031
136/244
(Continued)

FOREIGN PATENT DOCUMENTS

JP    S6170770 A    4/1986
JP    2003-008040 A    1/2003
(Continued)

OTHER PUBLICATIONS

Machine translation of Nakada Japanese Patent Document JP S61-70770, Apr. 11, 1986.*
(Continued)

*Primary Examiner* — Thienvu Tran
*Assistant Examiner* — Kevin J Comber
(74) *Attorney, Agent, or Firm* — Panitch Schwarze Belisario & Nadel LLP

(57) ABSTRACT

The present invention relates to a self-rechargeable hybrid battery and an electronic device including the same. Since the self-rechargeable hybrid battery includes a solar cell and a capacitor which is charged by current output from the solar cell, the charging efficiency of energy output from a solar cell may be increased in an eco-friendly manner, and the self-rechargeable hybrid battery includes electrodes having high transparency, electrical conductivity and interfacial capacitance, and thus may be applied to a transparent device.

10 Claims, 2 Drawing Sheets

(51) Int. Cl.
  *H01G 9/15* (2006.01)
  *H01G 9/28* (2006.01)
  *H02J 7/00* (2006.01)
  *H02J 7/35* (2006.01)
  *H01G 11/30* (2013.01)
  *H01G 11/48* (2013.01)
  *H01L 27/30* (2006.01)
  *H02J 7/34* (2006.01)
  *H01G 11/08* (2013.01)
  *H01L 51/00* (2006.01)
  *H01L 51/42* (2006.01)

(52) U.S. Cl.
  CPC ............. *H01G 11/30* (2013.01); *H01G 11/48* (2013.01); *H01L 27/301* (2013.01); *H01L 51/0037* (2013.01); *H02J 7/0042* (2013.01); *H02J 7/35* (2013.01); *H01G 11/08* (2013.01); *H01L 51/0036* (2013.01); *H01L 51/0047* (2013.01); *H01L 51/4253* (2013.01); *H02J 7/345* (2013.01); *Y02E 10/549* (2013.01); *Y02E 60/13* (2013.01)

(58) Field of Classification Search
  CPC ........ H01G 11/48; H02J 7/0042; H02J 7/345; H02J 7/35; H01L 27/301; H01L 51/0036; H01L 51/0037; H01L 51/0047; H01L 51/4253; Y02E 10/549; Y02E 60/13
  USPC .......................................................... 361/434
  See application file for complete search history.

(56) References Cited

U.S. PATENT DOCUMENTS

2011/0155962 A1* 6/2011 Choi ..................... C08F 234/04
  252/500
2012/0138913 A1* 6/2012 Alsayed ................ B22F 1/0025
  257/40

FOREIGN PATENT DOCUMENTS

| JP | 2012507872 A | 3/2012 |
| KR | 10-2010-0109104 A | 10/2010 |
| KR | 101104226 B1 | 1/2012 |

OTHER PUBLICATIONS

Machine translation of Han et al. Korean Patent Document KR 10-1104226, Jan. 11, 2012.*
Office Action dated Dec. 17, 2015 in KR Application No. 1020140060299.
Office Action dated May 29, 2015 in KR Patent Application No. 10-2014-0060299.

* cited by examiner

SELF-RECHARGEABLE HYBRID BATTERY AND ELECTRONIC DEVICE COMPRISING THE SAME

CROSS-REFERENCE TO RELATED APPLICATION

This application claims priority to and the benefit of Korean Patent Application No. 10-2014-0060299, filed on May 20, 2014, the disclosure of which is incorporated herein by reference in its entirety.

BACKGROUND

1. Field of the Invention

The present invention relates to a self-rechargeable hybrid battery and an electronic device including the same.

2. Discussion of Related Art

Solar energy has many advantages over existing energy sources. For example, solar energy is unlimited, and may be used anywhere. Solar energy is being advantageously used in a variety of fields. For example, a solar cell is mounted at a portion of a building or car onto which sunlight is radiated, and solar energy is converted to electricity by the mounted solar cell. Electricity obtained as described above may be applied to a diversity of electronic devices as lighting equipment such as lighting for buildings, a power source for cars, or portable electronic components such as mobile phones or video recorders. Although solar energy is obtained in the daytime when sunlight is radiated, when electricity obtained as described above is accumulated, electricity may be used at night or in rainy weather without sunlight. Accordingly, when the above described solar energy is used, solar energy may become an energy source not causing the depletion or destruction of natural resources.

Examples of electrical energy storage devices which store electricity converted by a solar cell include secondary batteries such as Ni-MH batteries, Ni—Cd batteries, lead-acid batteries and lithium secondary batteries, supercapacitors having high power density and unlimited charge/discharge life, aluminum electrolytic capacitors, ceramic capacitors, etc.

The capacitors use electrostatic characteristics, and thus have unlimited charge/discharge life and are semi-permanently available as compared to batteries using an electrochemical reaction. Further, the speed of charging/discharging energy of the capacitors is very fast, and thus the power density of the capacitors is dozens of times higher than that of the batteries. Accordingly, the capacitors have characteristics that the existing chemical cell batteries may not realize, and thus the application field of the capacitors is being increased throughout the industry. Particularly, in the era of high oil prices, the effectiveness of the capacitor as an energy buffer is being increased day by day in the development field of the next generation environmentally friendly vehicle such as an electric vehicle (EV), a hybrid electric vehicle (HEV), a fuel cell vehicle (FCV), etc.

That is, when a self-rechargeable hybrid battery including a solar cell which converts the solar energy to electricity and a capacitor which stores the electricity output from the solar cell for charging is manufactured, resources having high power density and charge/discharge life may be obtained without destroying the environment.

However, although electronic devices based on a transparent and flexible display are being developed currently, transparent batteries to drive the electronic devices have not yet been manufactured. Accordingly, there is a need to manufacture a transparent electrode of the batteries. To this end, the electrode is required to have low surface resistance, a high electrical conductivity, a high electrical capacity and preferably, a light transmittance of 80% or more in the visible light region.

SUMMARY OF THE INVENTION

The present invention relates to a self-rechargeable hybrid battery and an electronic device including the same, and the self-rechargeable hybrid battery includes a solar cell and a capacitor which is charged by current output from the solar cell.

The present invention provides a self-rechargeable hybrid battery and an electronic device including the same.

As an example of the self-rechargeable hybrid battery, there is provided a self-rechargeable hybrid battery including a solar cell and a capacitor which is charged by current output from the solar cell, wherein at least one of electrodes of the solar cell and capacitor includes a transparent substrate; and a conductive layer comprising metal nanowires and a conductive polymer formed on the transparent substrate.

As an example of the self-rechargeable hybrid battery, there is provided a self-rechargeable hybrid battery including a solar cell and a capacitor which is charged by current output from the solar cell, wherein at least one of electrodes of the solar cell and capacitor includes a transparent substrate; a metal nanowire formed on the transparent substrate; and a conductive polymer layer formed on the metal nanowire.

Further, the present invention may provide an electronic device including the self-rechargeable hybrid battery.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF THE INVENTION

Figure 1:
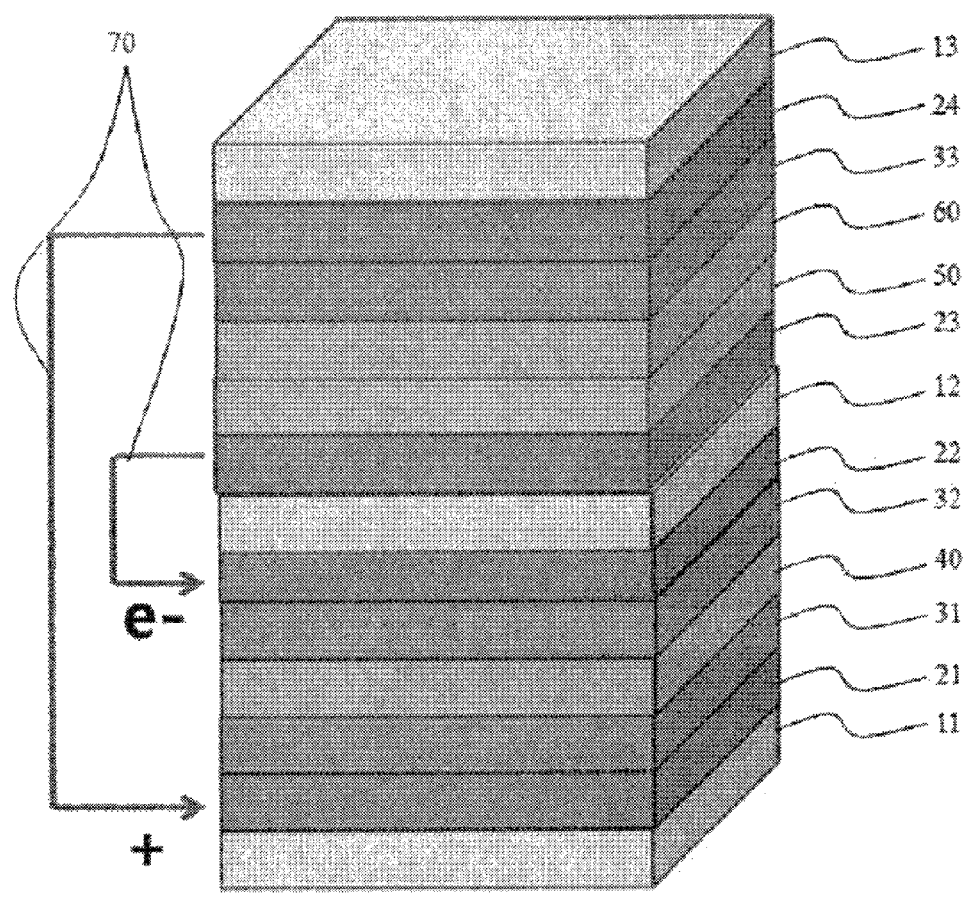
FIG. 1 is a schematic diagram of a self-rechargeable hybrid battery according to an embodiment of the present invention in which a solar cell and a capacitor are connected in series.

The present invention relates to a self-rechargeable hybrid battery and an electronic device including the same.

As an example of the self-rechargeable hybrid battery, there is provided a self-rechargeable hybrid battery including a solar cell and a capacitor which is charged by current output from the solar cell, wherein at least one of electrodes of the solar cell and capacitor includes a transparent substrate; and a conductive layer comprising metal nanowires and a conductive polymer formed on the transparent substrate.

Specifically, according to the embodiment of the present invention, the conductive layer comprises metal nanowires dispersed in a polymer matrix.

As an example of the self-rechargeable hybrid battery, there may be provided a self-rechargeable hybrid battery including a solar cell and a capacitor which is charged by current output from the solar cell, and at least one of electrodes of the solar cell and capacitor includes a transparent substrate; a metal nanowire formed on the transparent substrate; and a conductive polymer layer formed on the metal nanowire.

Specifically, according to the embodiment of the present invention, the conductive layer comprises a metal nanowire layer consisting of the metal nanowires, and a conductive polymer layer consisting of the conductive polymer formed on the metal nanowire layer.

For example, the conductive layer comprises 2 to 70, 2 to 60, 3 to 30, or 10 to 30 layers.

Specifically, according to the embodiment of the present invention, one self-rechargeable hybrid battery performs a series of processes in which a solar cell receives solar energy from the sun to output current, and current output from the solar cell is converted to chemical energy in a capacitor and is stored. The self-rechargeable hybrid battery may be used in an electronic device using the above-described method, and stored energy may be used at a desired time through external switching.

For example, an example of the capacitor may include a high-performance capacitor such as an electrolytic capacitor, a tantalum capacitor, a multilayer ceramic capacitor, a supercapacitor, and the like, and specifically, a supercapacitor may be used.

Here, at least one of electrodes of the solar cell and capacitor has a high interfacial capacitance and high transparency. Specifically, the electrode may have an interfacial capacitance of 0.002 F/cm$^2$ or more and a light transmittance of 65% or more. For example, the interfacial capacitance may be in the range of 0.002 to 0.010 F/cm$^2$, 0.004 to 0.010 F/cm$^2$ or 0.005 to 0.010 F/cm$^2$. Further, the light transmittance may be in the range of 65 to 95%, 85 to 95% or 85 to 92%. The electrode may exhibit a high interfacial capacitance in the above-described range, and a light transmittance in the above-described range enables the manufacture of a transparent electrode.

The transparent substrate used in the electrode of the solar cell and capacitor included in the self-rechargeable hybrid battery is not limited insofar as transparency is not hindered by the substrate, and for example, a plastic substrate including at least one type selected from the group consisting of polyethylene terephthalate, polyether sulfone, a polyimide, polystyrene and a polycarbonate may be used. When the above-described substrate is used as a transparent substrate, a transparent and flexible electrode may be manufactured.

Further, a metal nanowire may be formed on the transparent substrate. For example, the metal nanowire may contain at least one type selected from the group consisting of silver, gold, copper, zinc and tin. Specifically, the metal may be silver. A method for forming the metal nanowire is not particularly limited, and may be selected from the methods used in the related technical field. For example, a method for directly growing a metal nanowire on a transparent substrate using a growth solution, a method for coating a transparent substrate with a solution which includes a metal nanowire, or the like may be selected.

The metal nanowire formed on the transparent substrate may have an average diameter in the range of 0.1 to 100 nm and an average length in the range of 0.5 to 50 μm. For example, an average diameter of the metal nanowire may be in the range of 1 to 100 nm, 30 to 100 nm or 30 to 50 nm, and an average length of the metal nanowire may be in the range of 1 to 50 μm, 1 to 40 μm or 2 to 30 μm. When the metal nanowire has an average diameter and an average length in the above-described ranges, high mechanical stability and high transparency may be realized, and a high electrical conductivity may be realized by a large surface area.

A portion of the metal nanowire may be connected or intersected with another metal nanowire. For example, a high electrical conductivity may be shown through the portion connected or intersected with other metal nanowire.

As an example, the conductive polymer layer may include a structure of the following Formula 1.

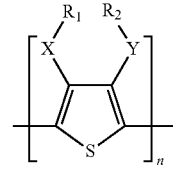

[Formula 1]

In Formula 1, X and Y each independently represent O, S, Si or N, $R_1$ and $R_2$ each may independently represent hydrogen, an alkyl group having 1 to 20 carbon atoms, an alkoxy group having 1 to 20 carbon atoms, an aryl group having 3 to 20 carbon atoms or a heteroaryl group having 2 to 20 carbon atoms, n may be an integer in a range of 2 to 2,000, and selectively, R1 and R2 may be bonded to each other to form a fused ring structure.

Here, the alkyl group may denote a functional group derived from a linear or branched saturated hydrocarbon.

Specific examples of the alkyl group may include a methyl group, an ethyl group, an n-propyl group, an isopropyl group, an n-butyl group, a sec-butyl group, a tert-butyl group, an n-pentyl group, a 1,1-dimethylpropyl group, a 1,2-dimethylpropyl group, a 2,2-dimethylpropyl group, a 1-ethylpropyl group, a 2-ethylpropyl group, an n-hexyl group, a 1-methyl-2-ethylpropyl group, a 1-ethyl-2-methylpropyl group, a 1,1,2-trimethyl-propyl group, a 1-propylpropyl group, a 1-methylbutyl group, a 2-methylbutyl group, a 1,1-dimethylbutyl group, a 1,2-dimethylbutyl group, a 2,2-dimethylbutyl group, a 1,3-dimethylbutyl group, a 2,3-dimethylbutyl group, a 2-ethylbutyl group, a 2-pentyl group, a 3-pentyl group, etc.

Further, the aryl group may denote a monovalent substituent derived from an aromatic hydrocarbon.

Specific examples of the aryl group may include a phenyl group, a naphthyl group, an anthracenyl group, a phenanathryl group, a naphthacenyl group, a pyrenyl group, a tolyl group, a biphenylyl group, a terphenylyl group, a chrycenyl group, a spirobifluorenyl group, a fluoranthenyl group, a fluorenyl group, a perylenyl group, an indenyl group, an azulenyl group, a heptalenyl group, a phenalenyl group, a phenanthrenyl group, etc.

Further, the heteroaryl group may denote an aromatic heterocylic group or heterocylic group derived from a monocyclic or condensed ring. The heteroaryl group may include at least one selected from the group consisting of nitrogen (N), sulfur (S), oxygen (O), phosphorus (P), selenium (Se) and silicon (Si) as a hetero atom.

Specific examples of the heteroaryl group may include at least one selected from the functional group with a hetero atom such as a pyrrolyl group, a pyridyl group, a pyridazinyl group, a pyrimidinyl group, a pyrazinyl group, a triazolyl group, a tetrazolyl group, a benzotriazolyl group, a pyrazolyl group, an imidazolyl group, a benzimidazolyl group, an indolyl group, a thiazolyl group, an isothiazolyl group, a benzothiazolyl group, a benzamide thiadiazolyl group, a phenothiazinyl group, an isoxazolyl group, a furazanyl group, a phenoxazinyl group, an oxazolyl group, a benzoxazolyl group, an oxadiazolyl group, a pyrazoloxazolyl group, an imidazothiazolyl group, a thienofuranyl group, a furopyrrolyl group and a pyridoxazinyl group, etc.

As an example, in the $K^{th}$ (K is an integer in the range of 2 to n) repeated structure of Formula 1 of the conductive polymer, at least one type of X, Y, $R_1$ and $R_2$ may be different as compared to those in the $K-1^{th}$ repeated structure of Formula 1 of the conductive polymer.

For example, the conductive polymer represented by the structure of Formula 1 may include structures of the following Formula 1-a to 1-c:

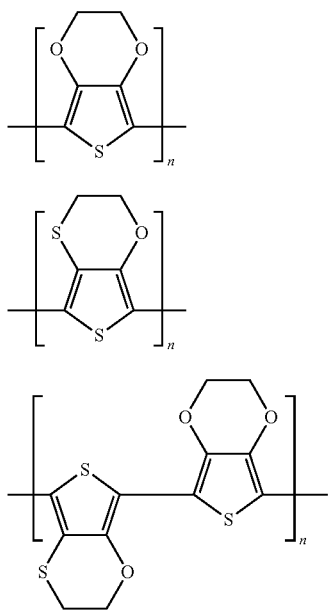

[Formula 1-a]

[Formula 1-b]

[Formula 1-c]

In Formulas 1-a to 1-c, n is an integer in the range of 2 to 2,000.

For example, the conductive polymer layer may be synthesized using a conductive polymer such as poly(3,4-ethylenedioxythiophene), a polypyrrole, a polythiophene, a polyaniline or the like and an emulsifier such as polystyrenesulphonic acid. Accordingly, in the synthesis, a small amount of the emulsifier may be present in the conductive polymer layer, but this emulsifier may be effectively removed using a post processing method according to the embodiment of the present invention. Consequently, an emulsifier hindering an electrical conductivity is removed from the conductive polymer layer, and thereby a high electrical conductivity may be realized.

The emulsifier may include an organic acid having at least one type of a functional group selected from the group consisting of a sulfonic acid, p-toluene sulfonic acid and a carboxylic acid, and the emulsifier may be selected from types of a conductive emulsifier used in a protective layer which will be described below. The conductive polymer layer may further include a dopant. A type of the dopant is not particularly limited insofar as the dopant increases the crystallinity of the polymer, and an example of the dopant may include at least one type selected from the group consisting of ethylene glycol, dimethyl sulfoxide, N-methyl-2-pyrrolidone, N,N-dimethylacetamide, 4-methoxyphenol, acetonitrile, cyclohexanone, nitromethane, methyl alcohol, tetrahydrofuran and formic acid.

The protective layer formed between the metal nanowire and conductive polymer layer may be further included.

The protective layer may include a graft copolymer of a conductive emulsifier and an alcohol polymer. For example, the graft copolymer of the conductive emulsifier and the alcohol polymer may be at least one type of compounds of the following Formulas 2 and 3.

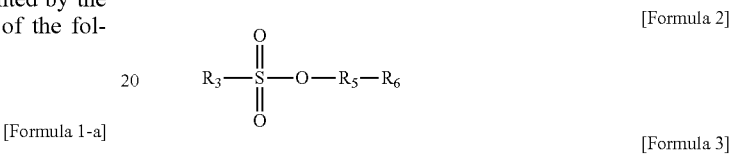

[Formula 2]

[Formula 3]

In Formulas 2 and 3, $R_3$ may be a polymer material including at least one type selected from the group consisting of 4-toluenesulphonic acid, 1-naphthalenesulphonic acid, dodecylbenzene sulphonic acid, polyvinylsulphonic acid and polystyrenesulphonic acid and having a molecular weight of 100 to 1,000,000, $R_4$ may be a polymer material including at least one type of a polyacrylic acid and a polymethacrylic acid and having a molecular weight of 100 to 1,000,000, $R_5$ may be a polymer material including an ether and having a molecular weight of 100 to 1,000,000, and $R_6$ may be at least one type selected from the group consisting of a poly(ethylene glycol)methyl ether, a poly(propylene glycol)acrylate, a poly(propylene glycol)methacrylate, a poly(propylene glycol)monobutyl ether and a poly(propylene glycol)monooctyl ether.

The conductive emulsifier is an organic acid and has a functional group selected from the group consisting of a sulfonic acid, a p-toluene sulfonic acid, and a carboxylic acid, and may be selected from the following Formula 4 or 5.

[Formula 4]

[Formula 5]

In Formulas 4 and 5, $R_7$ may be a polymer material including at least one type selected from the group consisting of 4-toluenesulphonic acid, 1-naphthalenesulphonic acid, dodecylbenzene sulphonic acid, polyvinylsulphonic acid and polystyrenesulphonic acid and having a molecular weight of 100 to 1,000,000, and $R_8$ may be a polymer material including at least one type of a polyacrylic acid and a polymethacrylic acid and having a molecular weight in the range of 100 to 1,000,000.

Specifically, the conductive emulsifier may include at least one type selected from the group consisting of 4-toluene sulphonic acid, 1-naphthalene sulphonic acid, dodecylbenzene sulphonic acid, polyvinylsulphonic acid, polystyrenesulphonic acid, a polyacrylic acid and a polymethacrylic acid.

The alcohol polymer may be a compound with the following Formula 6.

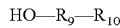    [Formula 6]

In Formula 6, $R_9$ may be a polymer material including an ether and having a molecular weight in the range of 100 to 1,000,000, and $R_{10}$ may be at least one type selected from the group consisting of a poly(ethylene glycol)methyl ether, a poly(propylene glycol)acrylate, a poly(propylene glycol) methacrylate, a poly(propylene glycol)monobutyl ether and a poly(propylene glycol)monooctyl ether.

The alcohol polymer is used to convert a hydrophilic group of the conductive polymer emulsifier to a hydrophobic group by forming a chemical bond with a hydrophilic group of the conductive polymer emulsifier through dehydration condensation polymerization. To this end, the alcohol polymer may have a structure in which a first end group is a hydrophilic group, and a second end group is a hydrophobic group.

The content of the alcohol polymer may have a weight ratio in a range of 20 to 50% with respect to the content of the conductive emulsifier. For example, the content of the alcohol polymer may have a weight ratio in a range of 20 to 45%, 25 to 40% or 25 to 35%. When the content of the alcohol polymer is adjusted to the above-described range, a conversion rate by dehydration condensation polymerization may be increased, and modification of unique properties of the conductive emulsifier may be prevented.

For example, as a method for preparing the graft copolymer of the conductive emulsifier and the alcohol polymer, a conductive emulsifier solution which includes a conductive emulsifier having a hydrophilic group is prepared while an alcohol polymer having two end groups in which a first end group is a hydrophilic group and a second end group is a hydrophobic group is prepared. Next, the alcohol polymer is mixed in the conductive emulsifier solution to prepare a mixed solution. Thereafter, a thermal treatment is performed on the mixed solution to cause dehydration condensation polymerization of the hydrophilic group of the conductive emulsifier and the hydrophilic group of the alcohol polymer, and thereby a graft copolymer having only a hydrophobic group may be formed.

In the above-described preparation method, the conductive emulsifier solution may be prepared by mixing deionized water and a conductive emulsifier, and the solid content of the conductive emulsifier solution may be in the range of 5 to 20 wt %. Further, a mixing process of the conductive emulsifier solution and the alcohol polymer is performed by stirring and dissolving, and the conductive emulsifier solution and the alcohol polymer may be dissolved by stirring at a temperature in the range of 10 to 150° C. for 5 to 120 minutes. Particularly, the thermal treatment process for dehydration condensation polymerization may be performed at a temperature of 50° C. or more but 300° C. or less for 5 to 60 minutes.

Specifically, when a metal nanowire forms a network like a mesh on a transparent substrate such as glass or plastic to be coated while forming layers, a transparent electrode having an excellent electrical conductivity may be manufactured due to high light transmittance characteristics and high electrical conductivity characteristics of a metal.

However, for example, when a nanowire electrode prepared using silver is exposed to air, a silver oxide layer such as $Ag_2O$, $AgO$, $Ag_2O_2$ or the like may be formed upon immediate contact of the nanowire electrode with oxygen. When the nanowire electrode is exposed to oxygen for a long time, the color of silver turns to a black color, and electrical resistance rapidly becomes 500 times (or more) higher. The above-described oxidation of silver results in a significant decrease in reliability of a transparent substrate. For example, there has been a problem in that a silver nanowire is oxidized due to the exposure to air for a long time. With respect to the above-described problem, according to the embodiment of the present invention, the protective layer is formed between the metal nanowire and the conductive polymer layer, and thereby the problem may be overcome, and an electrode having a high electrical conductivity may be manufactured.

The self-rechargeable hybrid battery has a structure including a solar cell and a capacitor, and the self-rechargeable hybrid battery may be implemented by connecting the solar cell and the capacitor in series or in parallel.

As an example of a self-rechargeable hybrid battery, a self-rechargeable hybrid battery may include a transparent substrate; a solar cell stacked on a surface of the transparent substrate; and a capacitor stacked on a surface opposite to the surface on which the solar cell is stacked, and may have a structure in which the solar cell and the capacitor are connected in series.

Here, the cathode of the solar cell and the anode of the capacitor, and the anode of the solar cell and the cathode of the capacitor may be connected by a metal wire. This can be confirmed by FIG. 1.

Referring to FIG. 1, the self-rechargeable hybrid battery may show a structure in which, with the transparent substrate 12 as a center, a transparent cell is formed on an upper surface of the transparent substrate 12 and a capacitor is formed on a lower surface of the transparent substrate 12.

Specifically, a capacitor having a sequentially stacked structure, in which electrodes including transparent substrates 11 and 12, metal nanowires 21 and 22 and conductive polymer layers 31 and 33 are disposed opposite to each other and an electrolyte layer 40 is stacked between the electrodes, and a solar cell having a sequentially stacked structure, in which electrodes including transparent substrates 12 and 13 and metal nanowires 23 and 24 are disposed opposite to each other and an electron transport layer 50, an active layer 60 and a hole transport layer 33 are sequentially stacked between the electrodes, may be formed in series.

Here, the cathode of the solar cell and the anode of the capacitor, and the anode of the solar cell and the cathode of the capacitor may be connected by a metal wire 70. Here, a metal wire is not particularly limited insofar as the metal does not hinder current from flowing.

As another example of a self-rechargeable hybrid battery, a self-rechargeable hybrid battery may include a first electrode and a second electrode, which are disposed opposite to each other, and a solar cell and a capacitor, which share the first electrode and the second electrode and are independently stacked between the first electrode and the second electrode, and may have a structure in which the solar cell and the capacitor are connected in parallel.

Figure 2:
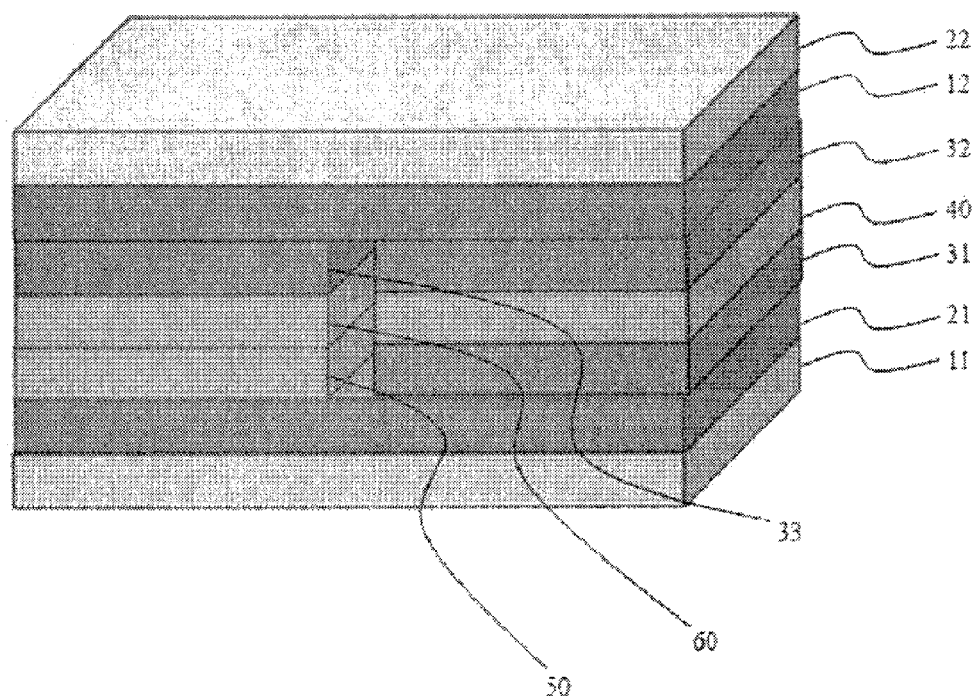
FIG. 2 is a schematic diagram of a self-rechargeable hybrid battery according to an embodiment of the present invention in which a solar cell and a capacitor are connected in parallel.

Referring to FIG. 2, the self-rechargeable hybrid battery may show a sequentially stacked structure in which electrodes including transparent substrates 11 and 12 and metal nanowires 21 and 22 are disposed opposite to each other, a solar cell is formed on about half of a surface between the electrodes, and a capacitor is formed on about half of the surface.

Specifically, sequentially stacked electrodes including transparent substrates 11 and 12 and metal nanowires 21 and 22 are disposed opposite to each other, a capacitor with a sequentially stacked structure including a conductive polymer layer 31, electrolyte layer 40 and conductive polymer layer 32 between the electrodes, and a solar cell including a sequentially stacked electron transport layer 50, active layer 60 and hole transport layer 33 between the electrodes may be formed in parallel.

Here, the capacitor and the solar cell share the electrodes including sequentially stacked transparent substrates 11 and 12 and metal nanowires 21 and 22.

The power conversion efficiency (PCE) of the solar cell may be 3% or more. The power conversion efficiency may denote an efficiency of absorbing light and converting light to electrical energy in the solar cell. Specifically, the power conversion efficiency may be in the range of 3 to 7%, 3 to 5% or 4 to 5%.

In the self-rechargeable hybrid battery, solar cell configurations except the electrode may include an electron transport material, an active material, a hole transport material and an electrolyte which are typically used.

For example, the electron transport material may include polyethylenimine ethoxylated (PEIE).

Further, the active material may include poly-3-hexylthiophene/[6,6]-phenyl-85 butyric acid methyl ester (P3HT/PCBM).

Further, the hole transport material may include polyethylene dioxythiophene:polystyrenesulphonic acid (PEDOT:PSS).

Further, the electrolyte may include at least one selected from the group consisting of an ammonium salt electrolyte, a sodium salt electrolyte, a lithium salt electrolyte, an iron salt electrolyte, a sulphonic acid compound and sulfuric acid.

For example, the ammonium salt electrolyte may include at least one type selected from the group consisting of tetra-n-$Bu_4NClO_4$, n-$Bu_4NPF_6$, n-$Bu_4NBF_4$ and n-$Et_4NClO_4$.

Further, for example, the sodium salt electrolyte may include at least one type selected from the group consisting of $NaPF_6$, $NaBF_4$ and $NaClO_4$.

Further, for example, the lithium salt electrolyte may include at least one type selected from the group consisting of $LiClO_4$, $LiPF_6$, $LiBF_4$, $LiN(SO_2CF_3)_2$, $LiN(SO_2C_2F_5)_2$, $LiCF_3SO_3$, $LiC(SO_2CF_3)_3$, $LiPF_4(CF_3)_2$, $LiPF_3(C_2F_5)_3$, $LiPF_3(CF_3)_3$, $LiPF_3(iso-C_3F_7)_3$, $LiPF_5(iso-C_3F_7)$ and a lithium salt electrolyte having a cyclic alkylene group. For example, the lithium salt electrolyte having a cyclic alkylene group may include $(CF_2)_2(SO_2)_2NLi$, $(CF_2)_3(SO_2)_2NLi$, etc.

For example, the iron salt electrolyte may include iron oxide (III) p-toluenesulphonic acid.

In the hybrid battery including the capacitor and the solar cell, the electrodes may have a structure in which a metal nanowire and a conductive polymer layer are stacked, and may be transparent and flexible.

As an example, a method for manufacturing the self-rechargeable hybrid battery includes forming a metal nanowire on a transparent substrate to form an electrode current collector; and forming a conductive polymer layer on the metal nanowire using a solution which includes a conductive polymer and an emulsifier.

For example, the electrode current collector may be formed by coating a transparent substrate which includes polyethylene terephthalate with a silver nanowire. Thereafter, a conductive polymer layer including at least one type selected from the group consisting of poly(3,4-ethylenedioxythiophene):polystyrenesulphonic acid, polypyrrole:polystyrenesulphonic acid, polythiophene:polystyrenesulphonic acid and polyaniline:polystyrenesulphonic acid may be formed on the metal nanowire.

Specifically, a type of the transparent substrate, a type of the metal nanowire, a structure of the metal nanowire, the conductive polymer and emulsifier may be the same as described above.

For example, the conductive polymer layer may include poly(3,4-ethylenedioxythiophene):polystyrenesulphonic acid (PEDOT:PSS) synthesized using a polystyrenesulphonic acid emulsifier. Specifically, the conductive polymer may have a number average molecular weight in the range of 50 to 100,000.

The solution which includes the conductive polymer and the emulsifier may further include an initiator. Two types of oxidizers may be mixed to be used as the initiator. For example, a first oxidizer of at least one type selected from the group consisting of sodium persulfate (SPS)), ammonium persulfate (APS) and 30 wt %-hydrogen peroxide and a second oxidizer of at least one type selected from the group consisting of $FeCl_3$, $Fe_2(SO_4)_3$ and $Fe(PTS)_3$ may be used.

The protective layer may be formed between the electrode current collector and the conductive polymer layer using a graft copolymer of a conductive emulsifier and an alcohol polymer. For example, a composition of the protective layer may be the same as described above.

After forming the conductive polymer layer, an operation of immersing a transparent substrate on which a metal nanowire, a protective layer and a conductive polymer layer are formed in a hydrophilic solvent may be further included.

This may be a process for improving the electrical conductivity of the self-rechargeable hybrid battery.

Specifically, after forming a metal nanowire, a protective layer and a conductive polymer layer on a transparent substrate, the transparent substrate on which the metal nanowire, protective layer and conductive polymer are formed is immersed in a hydrophilic solvent, and thereby an emulsifier remaining in the conductive polymer layer may be dissolved. Accordingly, the emulsifier causing resistance may be removed, and thus the electrical conductivity may be improved.

The hydrophilic solvent is not particularly limited insofar as the solvent may dissolve the emulsifier in the conductive polymer layer for removal, and for example, may include at least one type selected from the group consisting of ethylene glycol, dimethyl sulfoxide, N-methyl-2-pyrrolidone, N,N-dimethylacetamide, 4-methoxyphenol, acetonitrile, cyclohexanone, nitromethane, methyl alcohol, tetrahydrofuran, and formic acid. Specifically, the hydrophilic solvent may be dimethylsulfoxide.

Further, such a hydrophilic solvent may serve as a dopant of the conductive polymer. Upon the thermal treatment, polymer chains are rearranged to increase crystallinity and a grain size of the polymer chains, and thus electrons may easily move, and electrical properties may be significantly enhanced. For example, in the case of poly(3,4-ethylenedioxythiophene), when a thermal treatment is performed to dry a wet hydrophilic solvent after post processing, poly(3,4-ethylenedioxythiophene) chains may be rearranged. Accordingly, crystallinity and a grain size of the poly(3,4-ethylenedioxythiophene) chains are increased, electrons may easily move, and electrical properties may be significantly enhanced.

In an immersing process using the hydrophilic solvent, an immersing time may be in the range of 5 to 240 minutes. For example, the immersing time may be in the range of 30 to 180 minutes, 40 to 180 minutes or 50 to 150 minutes. When the immersing time is in the above-described range, an emulsifier which is present in a laminate may be sufficiently removed, and thus a high electrical conductivity may be realized.

Further, the present invention may include an electronic device including the self-rechargeable hybrid battery. For example, the self-rechargeable hybrid battery may be applied to a diversity of types of electronic devices. Specifically, the self-rechargeable hybrid battery is mounted on a portion of an electronic device to which the sunlight is radiated, solar energy is converted to electricity by the mounted self-rechargeable hybrid battery, and then the electricity charges a capacitor. Electricity obtained as described above may be applied to lighting equipment such as lighting of buildings, a power source of cars, or a portion of portable electronic components such as mobile phones or video recorders.

EXAMPLES

Hereinafter, the present invention will be described in detail with reference to embodiments according to the present invention, but the scope of the present invention is not limited to the following embodiments.

Preparation Example 1

In the self-rechargeable hybrid battery according to the embodiment of the present invention, an electrode was prepared. Specifically, referring to FIG. 1, a solution including 1 g of water and 0.01 g of a silver nanowire was prepared and applied on a polyethylene terephthalate (PET) transparent substrate, and then coating was performed using a method for a thermal treatment at a temperature of 150° C.

Thereafter, after the silver nanowire was coated with a solution in which 10 g of a compound of polyethylene dioxythiophene (PEDOT) and polystyrene sulfonic acid (PSS) (Aldrich CAS Number: 155090-83-8) and 0.5 g of dimethylsulfoxide (DMSO:SIGMA Aldrich 154938-100 ml) were mixed, a thermal treatment was performed at a temperature of 150° C. for about 15 minutes, and thereby a conductive polymer layer was formed on a substrate. Then, the transparent substrate on which the silver nanowire and the conductive polymer layer were formed was immersed in dimethyl sulfoxide which is a hydrophilic solvent, and was dried at a temperature of 150° C. for 10 minutes to prepare an electrode.

Here, a series of processes of forming a metal nanowire and a conductive polymer layer on the transparent substrate (PET) were performed using a bar-coating method, and were repeated 3 to 30 times.

Preparation Example 2

The electrode was prepared in the same manner as in Preparation Example 1 except that a graft copolymer in which a polystyrenesulphonic acid and a poly(ethylene glycol)methyl ether were bonded in the ratio of 5:2 was applied between the silver nanowire and the conductive polymer layer, and a thermal treatment was performed at a temperature of 150° C. to prepare a protective layer.

Example 1

The self-rechargeable hybrid battery according to the embodiment of the present invention was formed to have a serially connected structure.

Specifically, electrodes prepared in Preparation Example 1 were disposed opposite to each other, and an electrolyte was filled between the electrodes to form a capacitor. Thereafter, there was formed a solar cell sharing a PET transparent substrate of an electrode disposed at the top of the capacitor, in which a silver nanowire, an electron transport layer formed of polyethylenimine ethoxylated (PEIE), an active layer formed of poly-3-hexylthiophene/[6,6]-phenyl-c85 butyric acid methyl ester (P3HT/PCBM), a hole transport layer formed of polyethylene dioxythiophene:polystyrenesulphonic acid (PEDOT:PSS) and an electrode having a silver nanowire stacked on a PET transparent substrate were stacked. Here, the cathode of the solar cell and the anode of the capacitor, and the anode of the solar cell and the cathode of the capacitor were connected by a metal wire 70. This can be confirmed by FIG. 1.

Example 2

The self-rechargeable hybrid battery according to the embodiment of the present invention was formed to have a parallel connection structure.

Electrodes including stacked silver nanowires were disposed opposite to each other as in Preparation Example 2, a capacitor in which polyethylene dioxythiophene:polystyrenesulphonic acid (PEDOT:PSS), an electrolyte, and polyethylene dioxythiophene:polystyrenesulphonic acid (PEDOT:PSS) are sequentially stacked was formed on about half of a surface between the electrodes, and a solar cell in which an electron transport layer formed of polyethylenimine ethoxylated (PETE), an active layer formed of poly-3-hexylthiophene/[6,6]-phenyl-c85 butyric acid methyl ester (P3HT/PCBM), and a hole transport layer formed of polyethylene dioxythiophene:polystyrenesulphonic acid (PEDOT:PSS) were sequentially stacked was formed on about half of the surface. This can be confirmed by FIG. 2.

Comparative Example 1

The conductive polymer layer according to Example 1 was formed on indium tin oxide (ITO) to prepare an electrode.

Comparative Example 2

The conductive polymer layer according to Example 1 was formed on stainless steel to prepare an electrode.

Experimental Example 1

Figure 3:
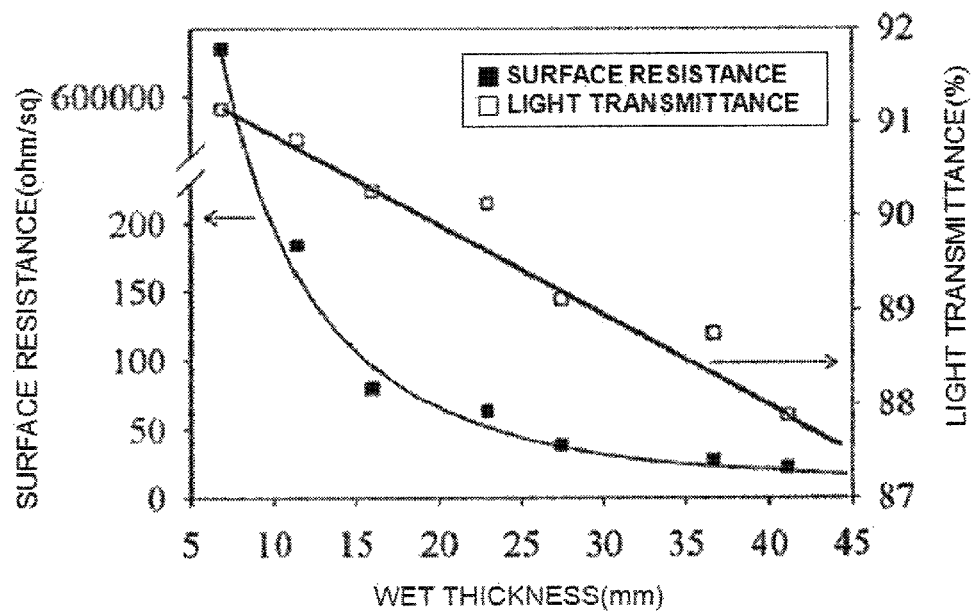
FIG. 3 is a graph showing physical properties of a self-rechargeable hybrid battery according to the embodiment of the present invention.

The measurement was performed with respect to the wet thickness, surface resistance and light transmittance according to the number of times of bar coating by which the metal nanowire and the conductive polymer layer were formed on the PET transparent substrate in Preparation Example 1. This can be confirmed by the following Table 1 and FIG. 3.

TABLE 1

| Number of times of bar coating | Wet thickness (mm) | Surface resistance (ohm/sq) | Light transmittance (%) |
|---|---|---|---|
| 0 | 0 | 0 | 91.40 |
| 3 | 6.86 | 681.50 | 91.15 |

TABLE 1-continued

| Number of times of bar coating | Wet thickness (mm) | Surface resistance (ohm/sq) | Light transmittance (%) |
|---|---|---|---|
| 5 | 11.43 | 183.80 | 90.82 |
| 7 | 16.00 | 79.53 | 90.27 |
| 10 | 22.90 | 63.05 | 90.13 |
| 12 | 27.40 | 38.227 | 89.11 |
| 16 | 36.60 | 27.79 | 88.75 |
| 18 | 41.10 | 22.27 | 87.88 |
| 30 | 44.90 | 15.00 | 71.01 |

Referring to Table 1, the electrode of the self-rechargeable hybrid battery according to the embodiment of the present invention may be determined to exhibit a light transmittance almost similar to that of a PET film, and thus may be manufactured as a transparent and flexible electrode.

Further, it may be determined that the self-rechargeable hybrid battery including the transparent and flexible electrode as prepared above may be applied to a transparent and flexible electronic device.

Experimental Example 2

The surface resistance, interfacial capacitance and light transmittance were measured using the electrodes prepared in Preparation Example 1 and Comparative Examples 1 to 2 (Number of times of bar coating: 30). The result is shown in the following Table 2.

TABLE 2

| | Surface resistance ($\Omega/\square$) | Interfacial capacitance (F/cm$^2$) | Light transmittance (%) |
|---|---|---|---|
| Preparation Example 1 | 15 | 0.003 | 71 |
| Comparative Example 1 | 13 | 0.001 | 55 |
| Comparative Example 2 | 0.002 | 0.013 | 0 |

Referring to Table 2, it may be determined that, as compared to an existing electrode using indium tin oxide which has been largely used but has a problem in that the electrode is expensive and is difficult to be applied in a large area, the electrode according to the embodiment of the present invention exhibits the surface resistance equivalent to that of the existing electrode, and excellent interfacial capacitance and light transmittance.

Experimental Example 3

In the self-rechargeable hybrid battery prepared in Example 2, the power conversion efficiency of the solar cell was measured. The result is shown in the following Table 3.

TABLE 3

| $V_{oc}$ (V) | $J_{sc}$ (mA/cm$^2$) | F.F. (%) | $\eta$ (%) |
|---|---|---|---|
| 0.58 | 10.16 | 0.48 | 3.0 |

Referring to Table 3, in the self-rechargeable hybrid battery according to the embodiment of the present invention, it may be determined that the power conversion efficiency ($\eta$) of the solar cell was about 3.00.

The electronic device having the self-rechargeable hybrid battery according to the embodiment of the present invention, which includes a solar cell and a capacitor charged by current output from the solar cell, can increase the charging efficiency of energy output from a solar cell in an eco-friendly manner, and includes electrodes having high transparency, electrical conductivity and interfacial capacitance, and thus can be applied to a transparent device.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A self-rechargeable hybrid battery comprising a solar cell and a capacitor which is charged by current output from the solar cell,
   wherein at least one of electrodes of the solar cell and capacitor includes:
   a transparent substrate;
   a metal nanowire layer consisting of metal nanowires, the metal nanowires having an average diameter in a range of 0.1 to 100 nm and an average length in a range of 0.5 to 50 µm;
   a protective layer including a graft copolymer of a conductive emulsifier and an alcohol polymer; and
   a conductive polymer layer consisting of a conductive polymer.

2. The self-rechargeable hybrid battery of claim 1, wherein the conductive polymer layer is formed on the metal nanowire layer and wherein the protective layer is formed between the metal nanowire layer and conductive polymer layer.

3. The self-rechargeable hybrid battery of claim 1, wherein at least one of electrodes of the solar cell and capacitor has an interfacial capacitance of 0.002 F/cm$^2$ or more and a light transmittance of 65% or more.

4. The self-rechargeable hybrid battery of claim 1, wherein the metal nanowire contains at least one metal selected from the group consisting of silver, gold, copper, zinc and tin.

5. The self-rechargeable hybrid battery of claim 1, wherein the conductive polymer includes a structure of the following Formula 1:

[Formula 1]

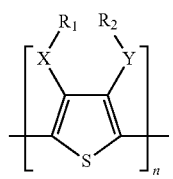

in Formula 1, X and Y each independently represent O, S, Si or N,
R$_1$ and R$_2$ each independently represent hydrogen, an alkyl group having 1 to 20 carbon atoms, an alkoxy group having 1 to 20 carbon atoms, an aryl group having 3 to 20 carbon atoms or a heteroaryl group having 2 to 20 carbon atoms,
n is an integer in a range of 2 to 2,000, and
selectively, R$_1$ and R$_2$ are bonded to each other to form a fused ring structure.

6. The self-rechargeable hybrid battery of claim 1, wherein the protective layer is at least one type of compounds of the following Formulas 2 and 3:

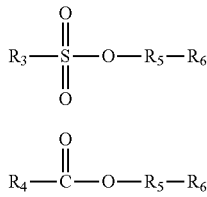

[Formula 2]

[Formula 3]

in Formulas 2 and 3, $R_3$ is a polymer material including at least one type selected from the group consisting of 4-toluenesulphonic acid, 1-naphthalenesulphonic acid, dodecylbenzene sulphonic acid, polyvinylsulphonic acid and polystyrenesulphonic acid and having a molecular weight in a range of 100 to 1,000,000, $R_4$ is a polymer material including at least one type of a polyacrylic acid and a polymethacrylic acid and having a molecular weight in a range of 100 to 1,000,000, $R_5$ is a polymer material including an ether and having a molecular weight in a range of 100 to 1,000,000, and $R_6$ is at least one type selected from the group consisting of a poly(ethylene glycol)methyl ether, a poly(propylene glycol)acrylate, a poly(propylene glycol)methacrylate, a poly(propylene glycol)monobutyl ether and a poly(propylene glycol)monooctyl ether.

7. The self-rechargeable hybrid battery of claim 1, comprising:
    a transparent substrate;
    a solar cell stacked on a surface of the transparent substrate; and
    a capacitor stacked on a surface opposite to the surface on which the solar cell is stacked,
    wherein the solar cell and capacitor are connected in series.

8. The self-rechargeable hybrid battery of claim 1, comprising:
    a first electrode and a second electrode, which are disposed opposite to each other; and
    a solar cell and a capacitor, which share the first electrode and the second electrode and are independently stacked between the first electrode and the second electrode,
    wherein the solar cell and capacitor are connected in parallel.

9. The self-rechargeable hybrid battery of claim 1, wherein the solar cell has a power conversion efficiency of 3% or more.

10. An electronic device, comprising the self-rechargeable hybrid battery of claim 1.

* * * * *